(12) United States Patent
Buynoski et al.

(10) Patent No.: US 6,583,012 B1
(45) Date of Patent: Jun. 24, 2003

(54) SEMICONDUCTOR DEVICES UTILIZING DIFFERENTLY COMPOSED METAL-BASED IN-LAID GATE ELECTRODES

(75) Inventors: Matthew S. Buynoski, Palo Alto, CA (US); Qi Xiang, San Jose, CA (US); Paul R. Besser, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 111 days.

(21) Appl. No.: 09/781,436

(22) Filed: Feb. 13, 2001

(51) Int. Cl.[7] ............... H01L 21/8234; H01L 21/44
(52) U.S. Cl. ............... 438/275; 438/197; 438/199; 438/655; 438/658; 438/660
(58) Field of Search .................. 438/199, 217, 438/275, 650.5, 680.5, 195, 197

(56) References Cited

U.S. PATENT DOCUMENTS

| | | | |
|---|---|---|---|
| 4,037,242 A | 7/1977 | Gosney | |
| 5,486,482 A | 1/1996 | Yang | |
| 5,523,246 A | 6/1996 | Yang | |
| 6,033,963 A | 3/2000 | Huang et al. | |
| 6,130,123 A | * 10/2000 | Liang et al. | 438/217 |
| 6,171,910 B1 | * 1/2001 | Hobbs et al. | 438/275 |
| 6,291,282 B1 | * 9/2001 | Wilk et al. | 438/203 |
| 6,303,418 B1 | * 10/2001 | Cha et al. | 438/199 |
| 6,444,512 B1 | * 9/2002 | Madhukar et al. | 438/203 |

* cited by examiner

Primary Examiner—Carl Whitehead, Jr.
Assistant Examiner—David L. Hogans

(57) ABSTRACT

MOS transistor and CMOS devices comprising a plurality of transistors including in-laid, metal-based gate electrodes of different composition are formed by a process comprising: depositing a first blanket layer of a first metal filling openings in an insulative layer at the bottom of which openings gate insulator layer segments of MOS transistor precursor regions formed in a semiconductor substrate are exposed; selectively forming at least one masking layer segment on the first blanket layer overlying selected ones of the MOS transistor precursor regions; depositing a second blanket layer of a second metal or silicon over the thus-formed structure, and effecting alloying or silicidation reaction between contacting portions of the first and second blanket layers overlying other ones of the MOS transistor precursor regions. Unnecessary layers remaining after alloying or silicidation reaction are then removed by performing planarization processing, e.g., by CMP. The invention also includes MOS and CMOS devices comprising differently composed in-laid, metal-based gate electrodes.

11 Claims, 7 Drawing Sheets

SEMICONDUCTOR DEVICES UTILIZING DIFFERENTLY COMPOSED METAL-BASED IN-LAID GATE ELECTRODES

CROSS-REFERENCE TO RELATED APPLICATION

This application contains subject matter similar to subject matter disclosed in co-pending U.S. patent application Ser. No. 09/813,310, filed on Mar. 21, 2001.

FIELD OF THE INVENTION

The present invention relates to methods of manufacturing semiconductor devices including a plurality of active device regions each having a gate electrode, e.g., CMOS devices comprised of one or more of each of NMOS and PMOS transistors. More specifically, the present invention relates to methods of manufacturing CMOS semiconductor devices wherein the source, drain, channel regions, and the gate electrodes of the various MOS transistors are formed in a self-aligned manner utilizing in-laid ("damascene") gates and the gate electrodes are formed of different metal-based, electrically conductive materials, and corresponding processing techniques therefor. The present invention has particular utility in the manufacture of high integration density semiconductor devices employing design rules of 0.20 µm and below, e.g., 0.15 µm and below.

BACKGROUND OF THE INVENTION AND RELATED ART

The escalating requirements for high density and performance (e.g., transistor and circuit speeds) associated with ultra-large scale integration ("ULSI") devices necessitate design rules for component features of 0.20 µm and below, e.g., 0.15 µm and below, such as source, drain, and gate regions and electrodes therefor formed in or on a common semiconductor substrate, challenges the limitations of conventional materials and manufacturing processes and necessitates use of alternative materials and development of new methodologies therefor.

An example of the above-mentioned challenge based upon the limitations inherent in conventional materials and methodologies utilized in the semiconductor integrated circuit ("IC") industry is the use of polysilicon for forming gate electrodes of metal-oxide-semiconductor ("MOS") transistors. Polysilicon is conventionally employed as a gate electrode material in MOS transistors in view of its good thermal stability, i.e., ability to withstand high temperature processing. More specifically, the good thermal stability of polysilicon-based materials permits high temperature annealing thereof during formation/activation of implanted source and drain regions. In addition, polysilicon-based materials advantageously block implantation of dopant ions into the underlying channel region of the transistor, thereby facilitating formation of self-aligned source and drain regions after gate electrode deposition/patterning is completed.

However, polysilicon-based gate electrodes incur a number of disadvantages, including, inter alia: (1) as device design rules decrease to below about 0.20 µm, polysilicon gates are adversely affected by poly depletion, wherein the effective gate oxide thickness ("EOT") is increased. Such increase in EOT can reduce performance by about 15% or more; (2) polysilicon-based gate electrodes have higher resistivities than most metal or metallic materials and thus devices including polysilicon as electrode or circuit materials operate at a much slower speed than equivalent devices utilizing metal-based materials. Further, a significant portion of the voltage applied to the gate during operation is dropped in the polysilicon due to the poor conductivity of silicon. As a consequence, in order to compensate for the higher resistance, polysilicon-based materials require silicide processing in order to decrease their resistance and thus increase the operational speeds of polysilicon-based devices to acceptable levels; (3) use of polysilicon-based gates necessitates ion implantation of different dopant atoms for p-channel transistors and n-channel transistors formed in a CMOS device, which different dopant species are required for the p-channel and n-channel transistors to have compatible threshold voltages ("$V_t$"). Disadvantageously, the threshold adjust implant is of sufficiently high doping concentration as to adversely impact the mobility of charge carriers in and through the channel region; and (4) polysilicon-based gate electrodes are less compatible with high dielectric constant ("high-k") materials (i.e., >5, preferably>20) which are desirable for use as gate oxide layers, than are metal-based gate electrodes.

In view of the above-described drawbacks and disadvantages associated with the use of polysilicon-based materials as gate electrodes in MOS and CMOS transistor devices, several process schemes for making self-aligned MOS and/or CMOS transistor devices utilizing in-laid ("damascene") metal or metal-based gate electrodes have been proposed, such as are described in U.S. Pat. No. 4,745,082 (Kwok et al.); U.S. Pat. No. 5,447,874 (Grivna et al.); U.S. Pat. No. 5,960,270 (Misra et al.); and U.S. Pat. No. 6,033,963 (Huang et al.).

Metal or metal-based gate electrode materials offer a number of advantages vis-à-vis conventional polysilicon-based materials, including: (1) since many metal materials are mid-gap work function materials, the same metal gate material can, in some instances, function as a gate electrode for both n-channel and p-channel transistors in a CMOS process without disadvantageously requiring threshold voltage ($V_t$) adjust implants while maintaining $V_t$ at compatible levels; (2) metal gate electrodes have a greater conductivity than polysilicon electrodes; (3) unlike polysilicon-based gate electrodes, metal gate electrodes do not suffer from polysilicon depletion which alters the EOT of an MOS transistor, thereby affecting the performance of the MOS device (i.e., thinner EOTs, while possibly resulting in an increased leakage current, result in faster operating devices); (4) metal gate MOS devices are advantageous for use in fully-depleted silicon-on-insulator ("SOI") devices since $V_t$ of these devices can be more accurately controlled; and (5) metal gate electrodes are more compatible with high-k dielectrics than conventional polysilicon processing.

The use of metal or metallic materials as replacements for polysilicon-based materials as gate electrodes in MOS and/or CMOS devices incurs several difficulties, however, which difficulties must be considered and overcome in any metal-based gate electrode process scheme, including: (1) metal and/or metal-based gates cannot withstand the higher temperatures and oxidative ambients which conventional polysilicon-based gate electrode materials can withstand; (2) several candidate metals or metallic materials for use as gate electrodes do not exhibit adequate adhesion in film form to surrounding layers of different materials when these metals or metallic materials are patterned to very small geometries; (3) some metal or metallic films are difficult to lithographically pattern and etch via conventional processing techniques because etching thereof may significantly damage underlying oxides, thereby adversely affecting device performance; (4) thermal processing subsequent to metal gate electrode formation may result in instability and degradation of the gate oxide due to chemical interaction between the metal and oxide at the metal gate-gate oxide interface; and (5) high thermal expansion coefficients of metals with respect to silicon can lead to undesirably high stress levels.

An example of a suitable process sequence for forming an in-laid (or damascene) gate electrode is disclosed in U.S. Pat. No. 5,960,270, which process overcomes the above-enumerated difficulties associated with the use of metal or metal-based materials as gate electrodes in MOS and/or CMOS transistor devices, and is described below with reference to FIGS. 1–7. Briefly stated, according to this process, an in-laid, metal-gated MOS transistor is fabricated which comprises self-aligned source and drain electrodes which are formed before the in-laid metal gate electrode is formed. An opening is formed in a dielectric layer overlying a semiconductor substrate to define locations for source and drain regions, which source and drain regions are formed by thermally out-diffusing dopant atoms from overlying metal silicide regions, which metal silicide regions have been formed into source and drain segments in a self-aligned manner by formation of the opening in the dielectric layer. As a consequence, the source and drain regions are formed self-aligned to the opening in the dielectric layer, and the latter are then subsequently filled with the metal or metal-based gate electrode material (after gate oxide formation by thermal oxidation of the substrate surface exposed through the opening). Since, according to this process scheme, doping of the source and drain regions is thermally driven and the source and drain regions are thermally activated before formation of the in-laid metal-based gate electrode, subjection of the latter to adverse thermal processing can be avoided.

Referring specifically to FIG. 1, a first process (according to the aforementioned U.S. Pat. No. 5,960,270) for fabricating an MOS transistor device 10 comprises providing a semiconductor substrate 12, typically a silicon (Si) wafer, in which trench-like dielectric field isolation regions 14 are formed, as by conventional techniques, e.g., shallow trench isolation ("STI"), followed by formation of a p-type or n-type well region 16 in the substrate region intermediate adjacent field oxide regions 14. It should be recognized that, while in the figure, only one (1) well region is illustrated, a plurality of well regions of different conductivity type may be formed in the substrate for fabrication of, e.g., a CMOS device. In any event, after formation of the well region 16, an about 300–400 Å thick silicide layer 18, preferably of either cobalt silicide ($CoSi_2$) or nickel silicide (NiSi) is selectively formed overlying the well region 16, as by a selective growth process. The silicide layer 18 is doped with an appropriate conductivity type dopant, depending upon whether an NMOS or PMOS transistor is to be formed, either by ion implantation subsequent to its deposition or by in situ doping during deposition.

Referring now to FIG. 2, a thin (i.e., about 500 Å thick) plasma-enhanced chemical vapor deposited ("PECVD") nitride layer 20 (utilized as an etch stop layer in subsequent processing) is then deposited so as to overlie the trench isolation regions 14 and the silicide layer 18. An about 1,000–4,000 Å thick (~2,000 521 being preferred), low temperature dielectric oxide layer 22, e.g., of tetraethyl orthosilicate ("TEOS") is then blanket-deposited over nitride layer 20.

Adverting to FIG. 3, an opening 24 is then formed in the oxide layer 22 overlying a central portion of well region 16, as by conventional photolithographic masking and etching techniques including plasma etching, the opening 24 extending through the nitride 20 and silicide 18 layers to expose at the bottom thereof a portion of the surface of semiconductor substrate 12. The opening 24 segments the silicide layer 18 into two separated portions, each of which is utilized for forming a respective underlying source or drain region of an MOS transistor in a following processing step.

Referring to FIG. 4, a thermal out-diffusion process is then performed for driving the dopant species out of the two silicide regions 18 to form respective underlying, fully self-aligned source and drain regions 26 and 28 within the substrate 12, the dopant species diffusing both vertically and laterally within the semiconductor substrate material. The doped silicide regions 18 remain in place for use as a portion of the source and drain electrodes, whereby the conductivity of these electrodes is enhanced.

As next illustrated in FIG. 5, an about 100 Å thick layer 25 of a sacrificial oxide, e.g., a silicon oxide, is formed, as by thermal oxidation, on the surface of the semiconductor substrate 12 exposed at the bottom of opening 24, and sidewall spacers 23, typically of a silicon nitride ($Si_xN_y$), are formed on the internal wall surface of the opening 24, e.g., by conventional techniques. A threshold voltage ($V_t$) adjust implant is then performed at a low ion implant energy to form $V_t$ adjust doped (i.e., implanted) region 31 within the portion of the well region 16 exposed through opening 24, after which the exposed portion of the sacrificial oxide layer 25 (i.e., the portion not covered by the sidewall spacers 23) is removed, as by etching. The spacers 23 provide a necessary offset for not only compensating for lateral diffusion of the source and drain regions 26 and 28 but also for electrical isolation of subsequent gate electrode formations from the silicide regions 18, whereby Miller effects are reduced.

With reference to FIG. 6, a thermal oxidation of the exposed portion of the well region 18 is performed to form a thermal gate oxide layer 27 (or a high-k dielectric layer), and a metal or metal-containing electrically conductive material (e.g., comprising one or more of molybdenum (Mo), tungsten (W), titanium (Ti), aluminum (Al), tungsten silicide ($WSi_2$), nickel silicide (NiSi), titanium nitride (TiN), and composites thereof is deposited, via a suitable deposition process, e.g., chemical vapor deposition ("CVD"), to form a sufficiently thick blanket layer 28a filling the opening 24 and extending over the upper surface of dielectric layer 22.

Referring now to FIG. 7, the in-laid gate electrode process is completed by performing a planarization step, typically chemical-mechanical-polishing ("CMP"), for removing the portions of blanket layer 28a extending over the dielectric layer and for rendering the upper surface of the remaining electrically conductive plug 28b (constituting the gate electrode) co-planar with the upper, exposed surface of dielectric layer 22. Electrical contacts to the source and drain regions 26 and 28 may then be formed, as by conventional photolithographic masking and etching techniques, to form openings in dielectric layer 22 extending to the respective silicide layers 18, which openings are then filled with an electrically conductive material, e.g., a metal.

Another example of a suitable process sequence disclosed in U.S. Pat. No. 5,960,270 for forming an in-laid gate electrode for use in MOS and/or CMOS devices is described below with reference to FIGS. 8–16. Briefly stated, according to this process, a polysilicon or amorphous silicon ("a-Si") "dummy" or temporary gate electrode is formed and utilized as a mask for implanting self-aligned source and drain regions in the substrate. After formation of the source/ drain regions, a dielectric layer is blanket-deposited and planarized (as by CMP) to expose a top portion of the dummy/temporary polysilicon or a-Si gate electrode. The polysilicon or a-Si dummy/temporary gate electrode is then removed to form a void where it was once located, which void is then filled with a metal or metal-containing gate electrode material, the latter being aligned to the source/drain regions by virtue of being formed in a location previously occupied by the self-aligned polysilicon or a-Si dummy/temporary gate.

Referring to FIG. 8, an initial step in the manufacture of semiconductor device 100 comprises formation of trench isolation regions 104 of a dielectric material in a suitable semiconductor substrate 102 (as in FIG. 1 of the first process), along with doped well regions 103 (i.e., at least one n-type well region and at least one p-type well region) for enabling CMOS device formation. A sacrificial thermal gate oxide layer 105 is formed over the upper surface of substrate 102 and then removed in order to yield a clean, active upper surface within the well region(s) 103.

Adverting to FIG. 9, a gate oxide layer 106 is formed on the exposed surface of well region 103, followed by sequential deposition thereon of a polysilicon dummy/temporary gate electrode 108 and an antireflective coating ("ARC") layer 110. The thus-obtained multi-layer structure is then subjected to photolithographic patterning/etching to form a dummy gate electrode stack.

With reference to FIG. 10, a sidewall gate oxidation is then performed to form sidewall oxidation layer 112, followed by formation thereon of tapered sidewall spacers 114, typically of a silicon nitride. Source and drain regions 118 are then formed in a self-aligned manner, as by conventional ion implantation and lightly-doped drain ("LDD") processing.

Referring to FIG. 11, a refractory metal layer (e.g., of Co or Ti) is then deposited over the exposed upper surface of the thus-obtained structure and thermally reacted with the exposed silicon (Si) portions of the source and drain regions 118 to form an upper metal silicide layer 116 in contact with a portion of each of the source and drain regions. Silicide layer 116 does not form on the top of the polysilicon dummy gate electrode layer 108 due to the presence of the ARC layer 110.

In a following step, illustrated in FIG. 12, a nitride layer 120 is formed over the upper, exposed surface by a plasma enhanced deposition process, and a blanket-deposited dielectric layer 122 (e.g., a TEOS layer) deposited thereover to form an inter-level dielectric layer ("ILD") 120/122. Then, as shown in FIG. 13, a suitable planarization process, e.g., CMP, is performed on the ILD layer utilizing polysilcon layer 108 as a polishing stop, thereby exposing the top surface of polysilicon dummy/temporary gate electrode layer 108.

Referring now to FIG. 14, the polysilicon dummy/temporary gate electrode layer 108 is removed by means of a selective etching process (e.g., reactive ion etching ("RIE") in a chlorine ($Cl_2$) plasma or wet polysilicon etching) to form a feature opening 124. $V_t$ is then optionally adjusted, as needed, by means of ion implantation through the feature opening 124 and the gate oxide layer 106 to form $V_t$ doped region 126. Gate oxide layer 106 is typically a sacrificial oxide layer which is removed and replaced with a high-k gate dielectric layer 125, as by thermal processing.

Adverting to FIG. 15, a metal or metal-based layer, e.g., of W, Mo, Ti, Al, TiN, $WSi_2$, $TiSi_2$, etc., is deposited as to fill the feature opening 124 and form a blanket or overburden layer 128a extending over the upper surfaces of the structure. In a following step, shown in FIG. 16, blanket or overburden layer 128a is planarized, as by CMP, to form a metal plug 128b filling the feature opening 124. Thus, metal gate electrode 128b is of substantially similar dimension and location as the dummy/temporary polysilicon gate electrode 108. As a consequence, the metal gate electrode 128b is self-aligned to the source/drain regions 118 formed within the substrate 102, as was dummy/temporary gate electrode 108.

In either of the above-described variants of in-laid metal gate electrode processing sequences, the ultimately formed gate oxide layer (27 or 125) is preferably comprised of a high-k dielectric material, inasmuch as such high-k dielectric materials advantageously provide greater coupling between the gate electrode and the underlying channel region of MOS transistors.

As indicated above, the same metal or metal-based material can, in some instances, function as a gate electrode for both n-channel (i.e., NMOS) and p-channel (i.e., PMOS) transistors in a CMOS device, without requiring transistor threshold voltage ($V_t$) implants while maintaining the latter at compatible levels. However, use of the same metal or metal-based material for both the NMOS and PMOS transistors of a CMOS device is neither practical or necessarily desirable, as for example., in instances where the characteristics of the various transistors of the CMOS (or other MOS transistor-based device) must be individually tailored or grouped for use in a particular application. As a consequence, the use of different metals as gate electrodes in MOS transistor-based devices, such as CMOS devices, has been proposed as a means for tailoring the characteristics or properties of individual transistors or groups/types of transistors. Disadvantageously, however, the use of different metals as gate electrodes in such plural MOS transistor-containing devices is problematic because of the difficulties associated with various metals, such as are described above, including, inter alia, inability to achieve good adhesion of many candidate gate electrode metals when in film form and/or patterned to very small geometries, and damage to the underlying gate insulator layer resulting from photolithographic patterning and etching according to conventional techniques and methodologies.

Accordingly, there exists a need for improved methodology for performing simple, reliable, rapid, and cost-effective formation of plural MOS transistor-containing devices, including CMOS devices, wherein different metal or metal-based materials are utilized for forming in-laid gate electrodes for various types of transistors, which methodology avoids the drawbacks and disadvantages associated with the conventional techniques and provides, inter alia, in-laid, metal-based gate MOS transistor and CMOS devices having precisely tailored transistor characteristics.

The present invention, wherein in a first step, a blanket layer of a first gate electrode metal is formed so as to contact an upper surface of each of a plurality of spaced-apart thin gate insulator layer segments formed on a semiconductor substrate surface and exposed via openings in an insulative layer; in a second step, hard mask layer segments are selectively formed over certain ones of the gate insulator segments; in a third step, a second metal layer or a Si layer is blanket-deposited over the thus-formed structure; in a fourth step, alloying of the first and second metals or silicidation of the first metal is effected at least over the other gate insulator layer segments; and in a fifth step, the excess thicknesses of the first and second blanket layers and the selectively formed hard mask segments are removed by performing planarization processing, e.g., by CMP, effectively addresses and solves the need for improved methodology for the manufacture of high quality, in-laid, metal-based gate electrode MOS transistor-based and CMOS devices having precisely controlled transistor characteristics. Further, the methodology provided by the instant invention can be performed rapidly and in a cost-effective manner utilizing conventional processing techniques and apparatus. Finally, the methodology afforded by the present invention enjoys diverse utility in the manufacture of numerous and various types of semiconductor devices and/or components utilizing metal or metal-based gate electrodes.

DISCLOSURE OF THE INVENTION

An advantage of the present invention is an improved method for manufacturing semiconductor devices including at least two metal-based, in-laid gate electrodes of different composition.

Another advantage of the present invention is an improved method for manufacturing a MOS transistor device including at least two differently composed in-laid, metal-based gate electrodes.

Yet another advantage of the present invention is an improved method for manufacturing semiconductor devices, such as CMOS devices comprising at least one NMOS transistor and at least one PMOS transistor, wherein each transistor type includes a differently composed metal-based, in-laid gate electrode.

Still another advantage of the present invention is an improved semiconductor device, such as a CMOS device comprised of NMOS and PMOS transistors, having differently composed, in-laid, metal-based gate electrodes to transistors of different conductivity type.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to an aspect of the present invention, the foregoing and other advantages are obtained in part by a method of manufacturing a semiconductor device including at least two metal-based, in-laid gate electrodes of different composition, comprising the sequential steps of:

(a) providing a semiconductor substrate;

(b) forming at least first and second spaced-apart, active device precursor regions on or within the semiconductor substrate;

(c) forming a first metal-based, in-laid gate electrode in electrical contact with the first active device precursor region, the first metal-based, in-laid gate electrode comprised of a first metal; and (d) forming a second metal-based, in-laid gate electrode in electrical contact with the second active device precursor region, the second metal-based, in-laid gate electrode comprised of an alloy of the first metal with a second metal or semi-metal or of an electrically conductive silicide of the first metal.

According to embodiments of the present invention, step (b) comprises forming spaced-apart transistor precursor regions, e.g., spaced-apart transistor precursor regions of different conductivity type, such as spaced-apart NMOS and PMOS transistor precursor regions as part of a process for forming a precursor structure for a CMOS device.

According to further embodiments of the present invention, step (d) comprises forming an alloy of the first metal with the second metal or semi-metal, or step (d) comprises forming a silicide of the first metal.

According to particular embodiments of the present invention, step (c) comprises forming the first metal-based, in-laid gate electrode from a first metal selected from the group consisting of molybdenum (Mo), tungsten (W), titanium (Ti), platinum (Pt), and aluminum (Al); and step (d) comprises forming the second metal-based, in-laid gate electrode from an alloy of the first metal with a second metal or semi-metal selected from elements in Groups IIA–VIA, IB, IIIB–VIIIB of the Periodic Table of the elements (Sargent-Welch Co., 1968), and lanthanide series elements or from a silicide of the first metal.

According to further embodiments of the present invention, step (c) includes steps of:

(i) forming a first blanket layer of the first metal overlying and in electrical contact with each of the first and second active device precursor regions; and (ii) selectively forming a layer of a hard mask material on a portion of the first blanket layer overlying the first active device precursor region; and step (d) includes steps of:

(i) forming a second blanket layer of the second metal or semi-metal or silicon (Si) overlying the second active device precursor region and the layer of hard mask material overlying the first active device precursor region; and (ii) effecting alloying or silicidation reaction of at least the portion of the second blanket layer in contact with the portion of the first blanket layer in electrical contact with the second active device precursor region.

According to embodiments of the present invention, the method further includes a step (e) of removing the hard mask layer and excess thickness portions of the first and second blanket layers by means of planarization processing, e.g., by performing chemical-mechanical polishing (CMP).

According to another aspect of the present invention, a method of manufacturing a Si-based semiconductor device comprised of at least first and second MOS transistors, the first MOS transistor including a first in-laid gate electrode comprised of a first metal and the second MOS transistor including a second in-laid gate electrode comprised of an alloy of the first metal with a second metal or semi-metal or a silicide of the first metal, comprises the steps of:

(a) providing a Si-based substrate having a surface defining at least spaced-apart first and second transistor precursor regions where the first and second MOS transistors are to be formed;

(b) forming a pair of spaced-apart source and drain regions in each of the first and second transistor precursor regions, each pair of spaced-apart source and drain regions extending to the substrate surface and including a pair of opposed, facing edges with a space therebetween;

(c) forming a layer of an insulative material extending over the substrate surface;

(d) exposing first and second portions of the substrate surface at the first and second transistor precursor regions, the exposed portions including the pairs of facing edges of the pairs of spaced-apart source and drain regions and the spaces therebetween;

(e) forming thin gate insulator layer segments on each of the first and second exposed portions of the substrate surface;

(f) forming a first blanket layer of the first metal over the surface of the thus-formed structure, the first blanket layer of the first metal overlying and in contact with each of the thin gate insulator segments;

(g) selectively forming a layer of a hard mask material on a portion of the first blanket layer overlying the first transistor precursor region;

(h) forming a second blanket layer of the second metal or semi-metal or Si over the surface of the thus-formed structure, such that a portion of the second blanket layer contacts an underlying portion of the first blanket layer overlying the second transistor precursor region;

(i) effecting alloying or silicidation reaction of the contacting portions of the first and second blanket layers; and (j) removing the hard mask layer and portions of the first and second blanket layers extending over the layer of insulative material formed in step (c) to form a planarized surface including the first and second in-laid gate electrodes of the first and second MOS transistors.

According to embodiments of the present invention, step (f) comprises forming the first blanket layer from a first metal selected from the group consisting of Mo, W, Ti, Pt and Al; and step (h) comprises forming the second blanket layer from a second metal or semi-metal selected from elements in Groups IIA–VIA, IB, IIIB–VIIIB of the Periodic Table, and lanthanide series elements or from Si.

According to further embodiments of the present invention, step (a) comprises providing a substrate wherein the first and second transistor precursor regions are of opposite conductivity type for forming therein NMOS and PMOS transistors of a CMOS device; and wherein the first and second metal or semi-metal or first metal and Si utilized in performing steps (f) and (h), respectively, are selected on the basis of the conductivity type of the first and second MOS transistors.

According to one alternative embodiments of the present invention, step (b) comprises selectively forming first and second pairs of spaced-apart metal silicide layers on respective spaced-apart portions of the substrate surface corresponding to the first and second transistor precursor regions, introducing at least one dopant species into the first and second pairs of spaced-apart metal silicide layers, and forming each of the pairs of spaced-apart source and drain regions by out-diffusion of the at least one dopant species from each of the pairs of spaced-apart source and drain regions into the respective transistor precursor regions; and step (d) comprises forming first and second openings extending through the layer of insulative material to form the first and second exposed portions of the substrate surface at the respective bottoms of each of the first and second openings.

According to another alternative embodiment of the present invention, step (b) comprises forming first and second temporary gate electrode structures on respective spaced-apart portions of the substrate surface corresponding to the first and second transistor precursor regions, and selectively implanting at least one species of dopant-containing ions into the substrate surface to form the pairs of source and drain regions, the temporary gate electrode structures forming at least part of an implantation mask during the implanting; step (c) comprises forming a blanket layer of an insulative material extending over the temporary gate electrode structures and the substrate surface, followed by planarization processing of the blanket layer to remove at least the portion thereof overlying the temporary gate electrode structures; and step (d) comprises removing the temporary gate electrode structures to form the first and second exposed portions of the substrate surface.

According to yet another aspect of the present invention, a semiconductor device comprises:

a semiconductor substrate including a surface having formed therein or thereon at least one first active device region and at least one second active device, the first and second active device regions including respective first and second in-laid, metal-based gate electrodes, the first in-laid, metal-based gate electrode being comprised of a first metal and the second in-laid, metal-based gate electrode being comprised of an alloy of the first metal with a second metal or semi-metal or of an electrically conductive silicide of the first metal.

According to embodiments of the present invention, the substrate is Si-based, the first active device region comprises a first conductivity type MOS transistor, the second active device region comprises a second, opposite conductivity type MOS transistor, and the semiconductor device is a CMOS device.

According to further embodiments of the present invention, the first in-laid, metal-based gate electrode comprises a first metal selected from the group consisting of Mo, W, Ti, Pt, and Al; and the second in-laid, metal-based gate electrode comprises an alloy of the first metal with a second metal or semi-metal selected from elements in Groups IIA–VIA, IB, IIIB–VIIIB of the Periodic Table and lanthanide series elements, or the first in-laid, metal-based gate electrode comprises a first metal selected from the group consisting of Mo, W, Ti, Pt, and Al; and the second in-laid, metal-based gate electrode comprises an electrically conductive silicide of the first metal.

Additional advantages and aspects of the present invention will become apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention is based upon the discovery that MOS transistor and CMOS devices including a plurality of in-laid, metal-based gate electrodes of different composition can be readily formed by a process which avoids the aforementioned drawbacks, disadvantages, and difficulties associated with the use of thin metal films patterned into the very small geometries required for manufacturing submicron-dimensioned transistor devices. According to the invention, a first metal-based, in-laid gate electrode material is composed of a first metal and a second metal-based, in-laid gate electrode material is composed of an alloy of the first metal with a second metal or an electrically conductive silicide of the first metal. A key feature, i.e., advantage, of the present invention is the elimination of the requirement for performing several steps for patterning of individual metal layers utilized for forming the first and second metal-based gate electrode materials. The elimination of several steps for patterning is accomplished by use of separate blanket deposition processes for forming first and second blanket-deposited layers of first and second metals or a layer of the first metal and a layer of Si, together with selective formation of (a) hard mask layer segment(s) intermediate the first and second blanket-deposited layer for separating, thus preventing contact between the first and second blanket layers at selected locations. Another key feature of the present invention is the simultaneous removal of all superfluous/unnecessary portions and/or excess thicknesses of the first and second blanket layers and the hard mask layer after alloying or silicidation reaction by means of planarization processing, e.g., CMP. As a consequence of the inventive methodology, high-quality, in-laid metal gate MOS transistor and CMOS devices including transistors having metal gate electrodes of different composition can be readily and cost-effectively fabricated with precise tailoring of transistor characteristics according to the transistor conductivity type and/or function.

Figure 1:
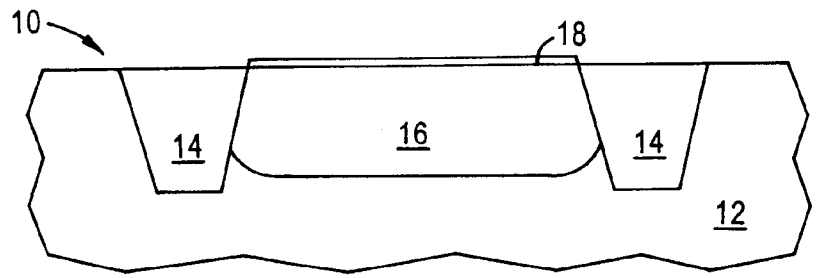
FIGS. 1–7 are schematic, simplified, cross-sectional views illustrating stages in the formation of an in-laid gate MOS transistor according to a first method.
Figure 2:
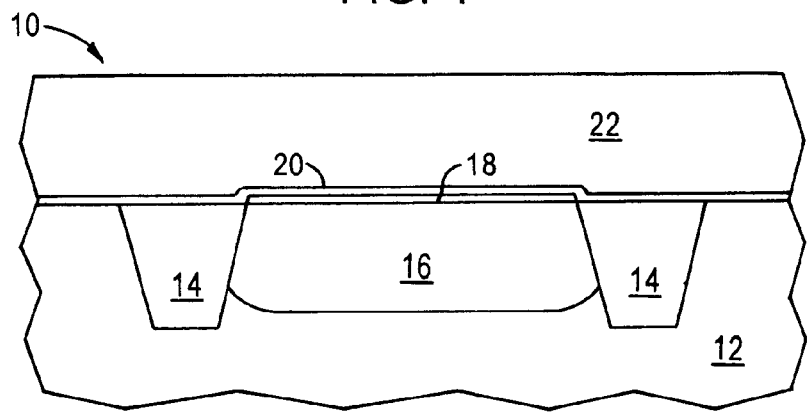
Figure 3:
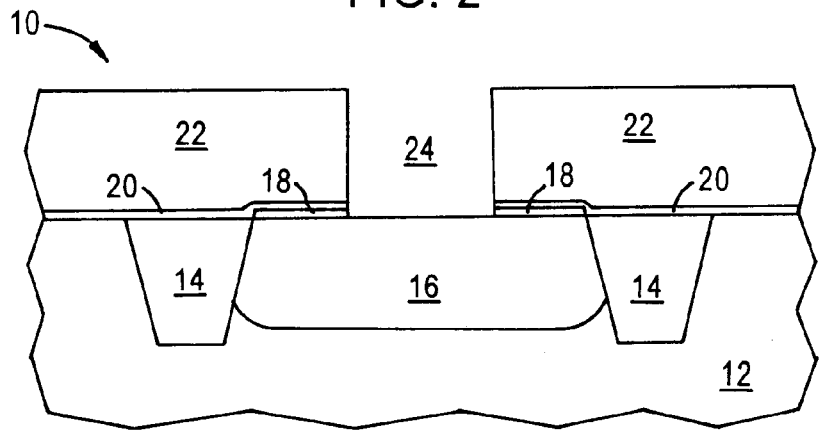
Figure 4:
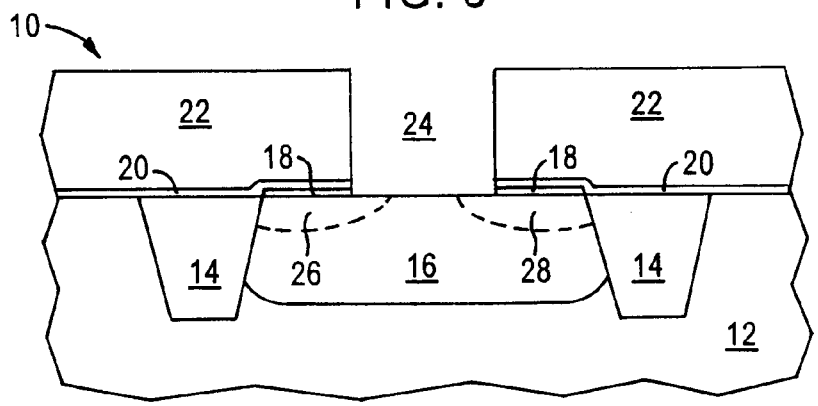
Figure 5:
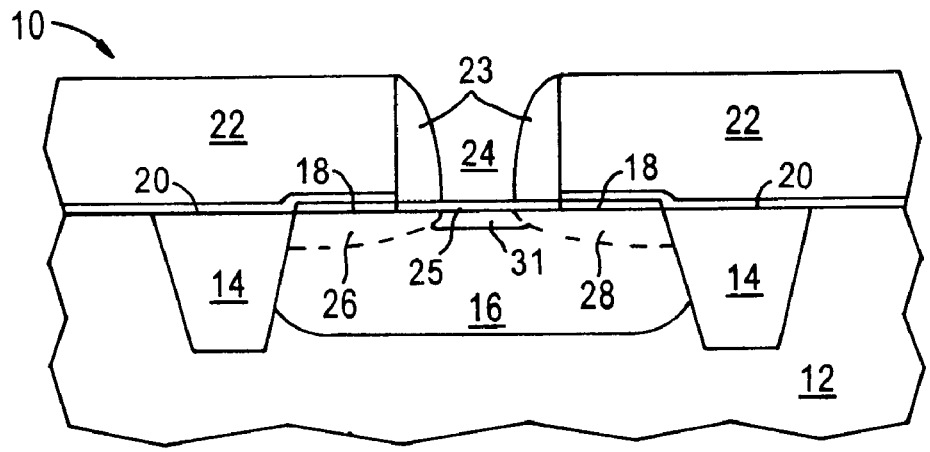
Figure 6:
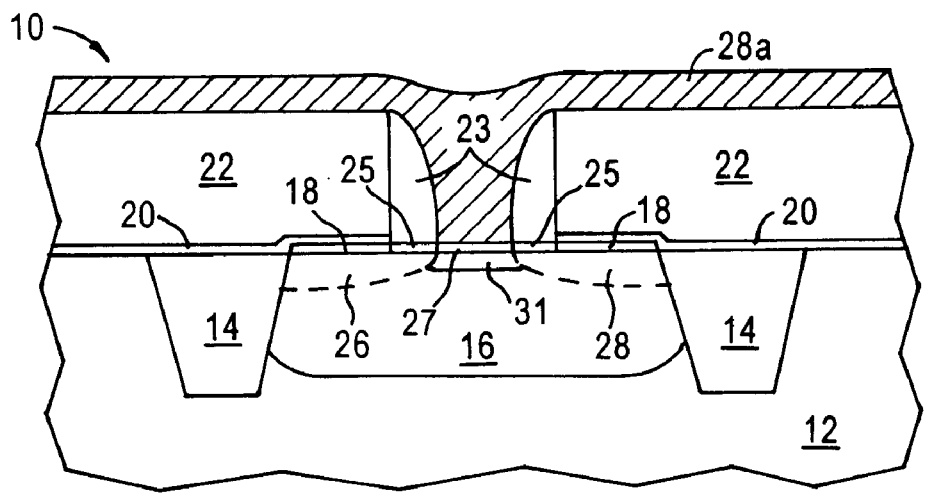
Figure 14:
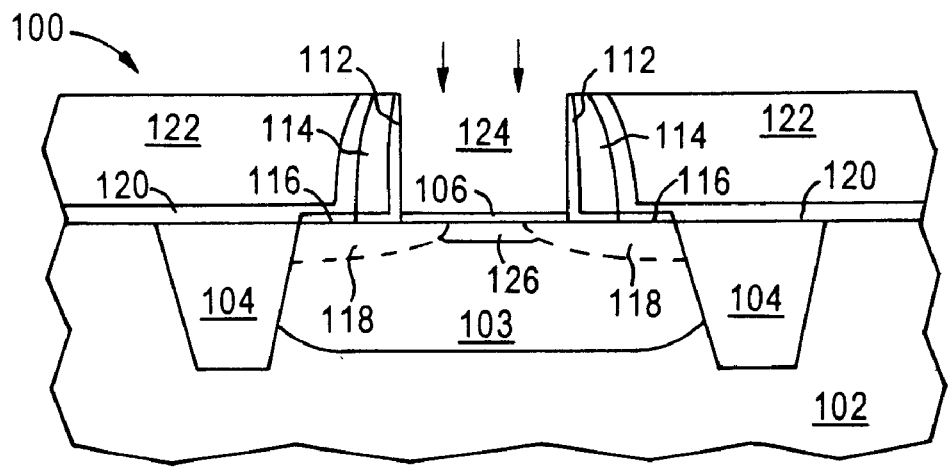
Figure 15:
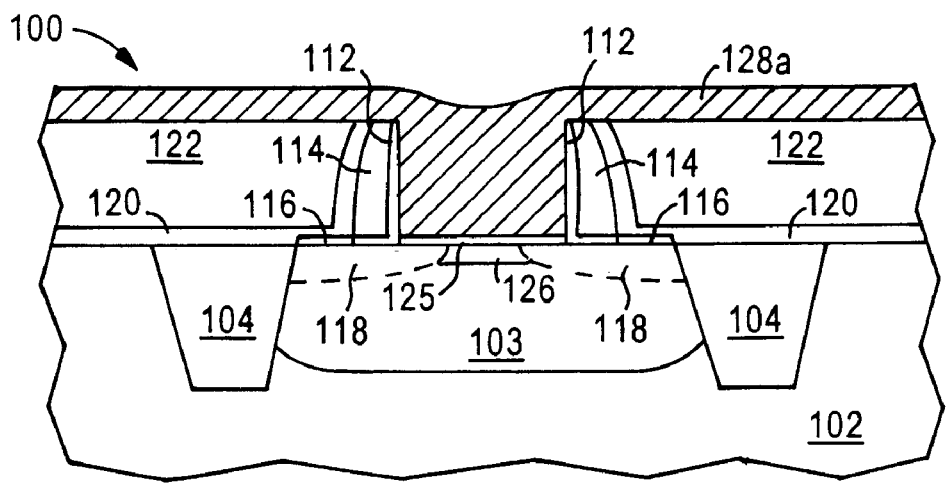

More specifically, the inventive methodology is applicable to all manner of processing sequences for the formation of in-laid metal gate MOS transistor/CMOS devices, etc., wherein, as part of the fabrication methodology, surfaces of thin gate insulator layer segments are exposed through openings formed in an overlying dielectric layer, e.g., as in the above-described first and second alternative methods for producing the intermediate structures or stages respectively illustrated in FIGS. 5 and 14.

Figure 17:
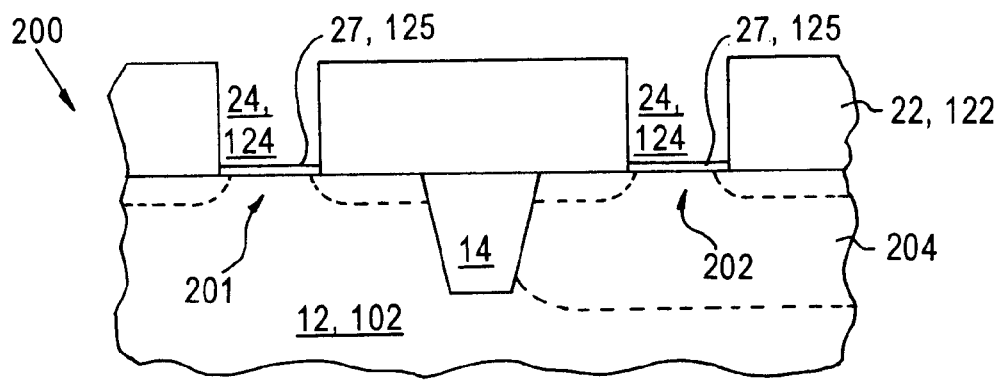
FIGS. 17–22 are schematic, simplified, cross-sectional views illustrating stages in the formation of an in-laid, metal-based gate electrode CMOS device according to an embodiment of the present invention.

Referring now to FIG. 17, shown therein is a schematic cross-sectional view of a CMOS precursor structure 200 prepared as a first step according to the present invention, and comprising spaced-apart NMOS and PMOS transistor precursor regions 201, 202, respectively, formed in a p-type semiconductor substrate 12 or 102 on opposite sides of trench isolation region 14, wherein PMOS transistor 202 includes n-type well region 204 formed within the p-type substrate 12/102. Thin gate oxide layer segments 27 or 125 of each of the transistor precursor regions 201, 202 are exposed at the bottoms of openings 24 or 124 formed in insulative layer 22 or 122. CMOS precursor structure 200 is thus analogous to the single MOS precursor structures of FIGS. 5 and 14, formed, e.g., according to either of the first or second alternative processing sequences. Further, certain features which are not critical for an understanding of the present invention, for example, sidewall spacers 23, are not included in the figure for illustrative simplicity.

Figure 18:
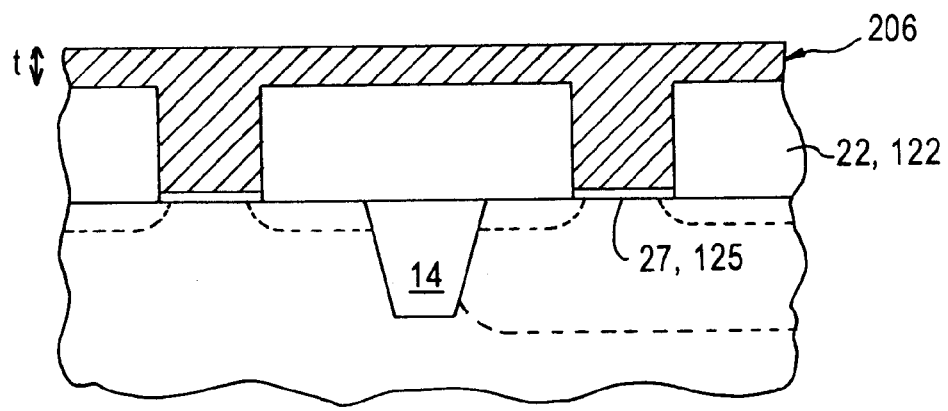

According to a next step of the invention, shown in FIG. 18, a first blanket layer 206 of a first metal is deposited over the surface of the CMOS precursor structure 200, as by a suitable low energy deposition process which does not materially damage the thin gate oxide layer segments 27 or 125, e.g., a CVD process, so as to fill each of the openings 24 or 124 formed in the insulative layer 22 or 122 and extend thereover as a blanket or "overburden" layer of thickness t of from about 500 to about 2,000 Å. Metals typically utilized for forming first blanket layer 206 include Mo, W, Ti, Pt, and Al.

Figure 19:
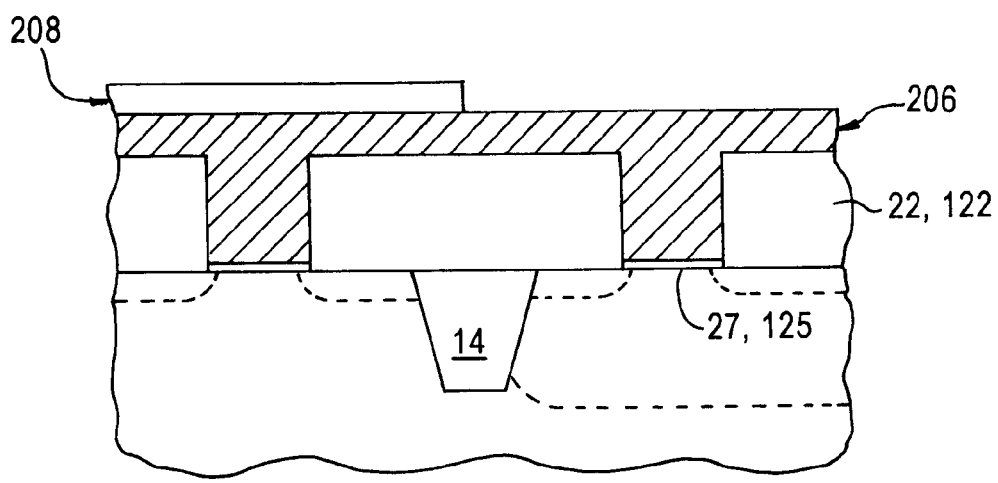

Adverting to FIG. 19, in a next step according to the invention, a layer of a hard mask material, typically a layer of $SiO_2$, SiON, or $Si_3N_4$ from about 500 to about 2,000 Å thick is deposited over the first blanket layer 206 of first metal by means of a conventional CVD or PVD technique and patterned, as by use of conventional photolithographic masking and etching techniques, to form a masking layer segment 208 overlying a selected one of the MOS transistor precursor regions, illustratively NMOS precursor region 201.

Figure 20:
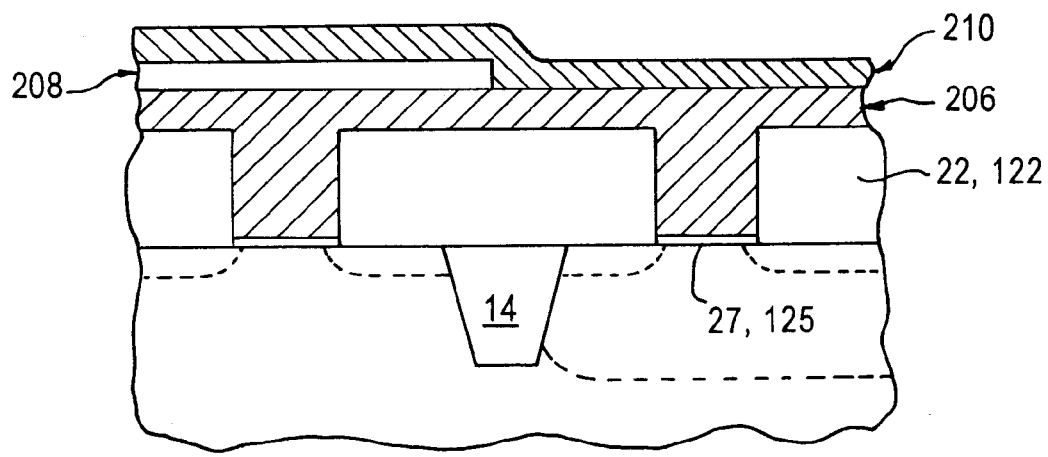
Figure 21:
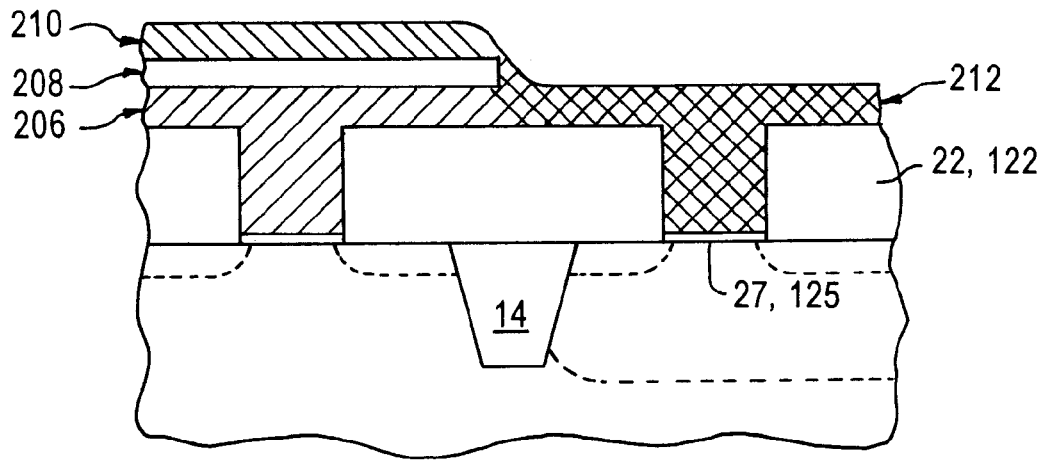

Referring now to FIGS. 20–21, a second blanket layer 210 of a second metal or semi-metal, selected from elements in Groups IIA–VIA, IB, IIIB–VIIIB of the Periodic Table of elements, and lanthanide series elements or silicon (Si) is deposited over the upper surface of the thus-formed structure, as by any suitable technique, e.g., CVD, LPCVD, PVD, etc., and then subjected to a thermal treatment at an elevated temperature in an inert atmosphere for effecting alloying or silicidation reaction between the first and second blanket layers 206, 210, respectively, where they are in overlying contact, e.g., to selectively form a metal alloy or metal suicide layer 212 at the PMOS transistor precursor region 202 in the illustrated example. The thickness of the second blanket layer 210 for forming the metal alloy or metal silicide layer 212 for use in a particular situation is determined, inter alia, in the case where first and second metals are utilized for the first and second blanket layers, on the basis of the particular first and second metals utilized for the first and second blanket layers and the specific alloy composition desired to be formed; and in the case where a first metal blanket layer and a Si second blanket layer are utilized, on the basis of the particular metal and its Si consumption ratio. Similarly, the alloying or silicidation reaction conditions for use in a particular situation are determined on the basis of the particular pair of materials utilized for the first and second blanket layers. By way of illustration only, according to the invention, a first blanket layer 206 of Al from about 1000 to about 3,000 Å thick may be alloyed for the full thickness thereof with a second blanket layer 210 of an alloying metal (e.g., Ti) or semi-metal from about 300 to about 1,000 Å thick by thermal treatment in an inert atmosphere at a temperature of from about 250 to about 400° C. for from about 10 to about 20 min. to form an Al alloy (e.g., Al—Ti). Similarly, and by way of illustration only, according to the present invention, a first blanket layer 206 of Pt from about 1,000 to about 3,000 Å/thick may be silicided for the full thickness thereof with a second blanket layer 210 of Si from about 300 to about 1,000 Å thick by thermal treatment in an inert atmosphere at a temperature of from about 200 to about 500° C. for from about 10 to about 30 min.

Figure 7:
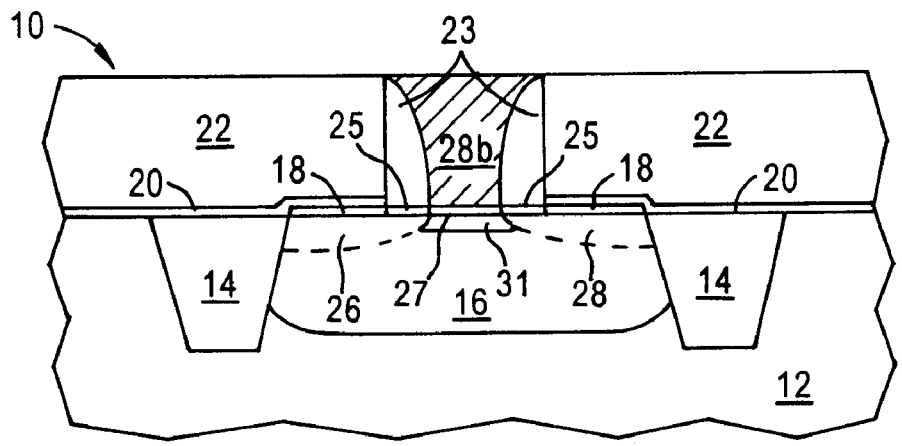
Figure 8:
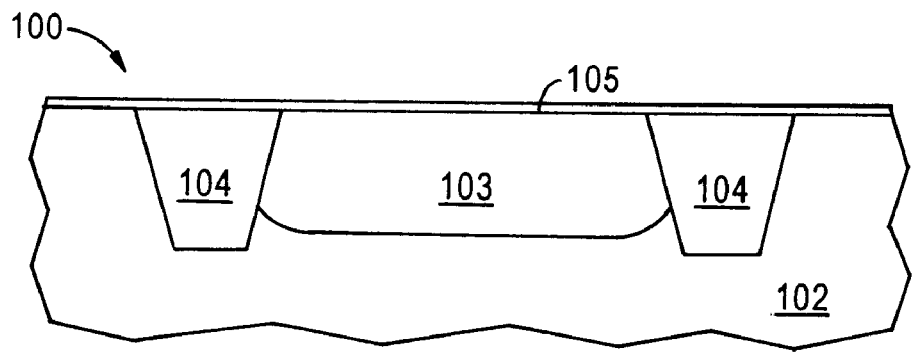
FIGS. 8–16 are schematic, simplified, cross-sectional views illustrating stages in the formation of an in-laid gate electrode MOS transistor according to a second method.
Figure 9:
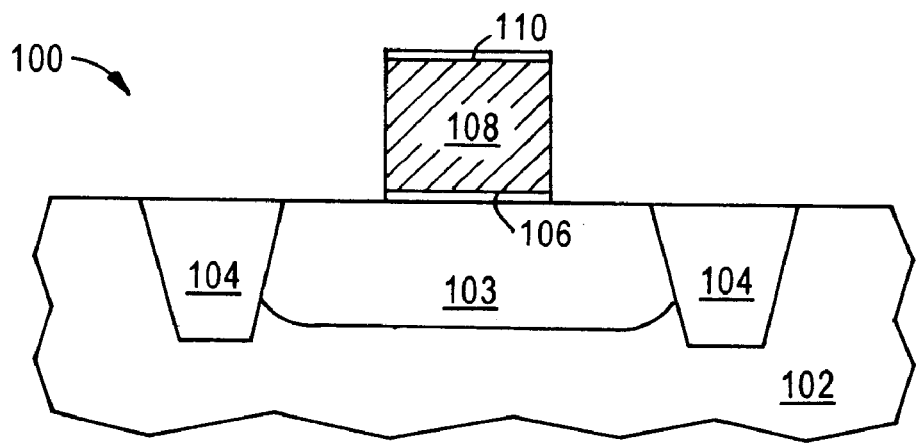
Figure 10:
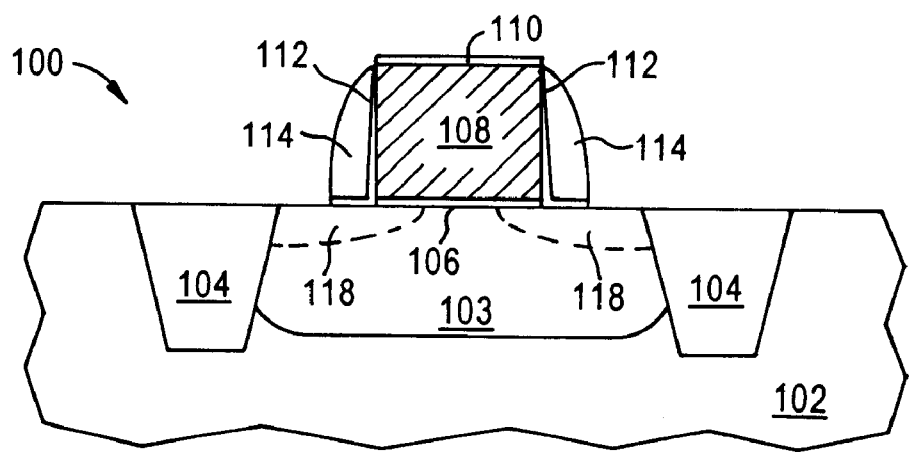
Figure 11:
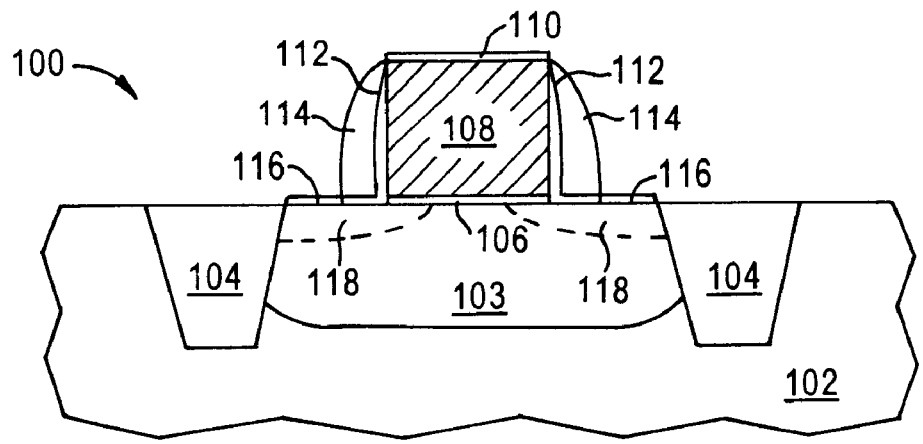
Figure 12:
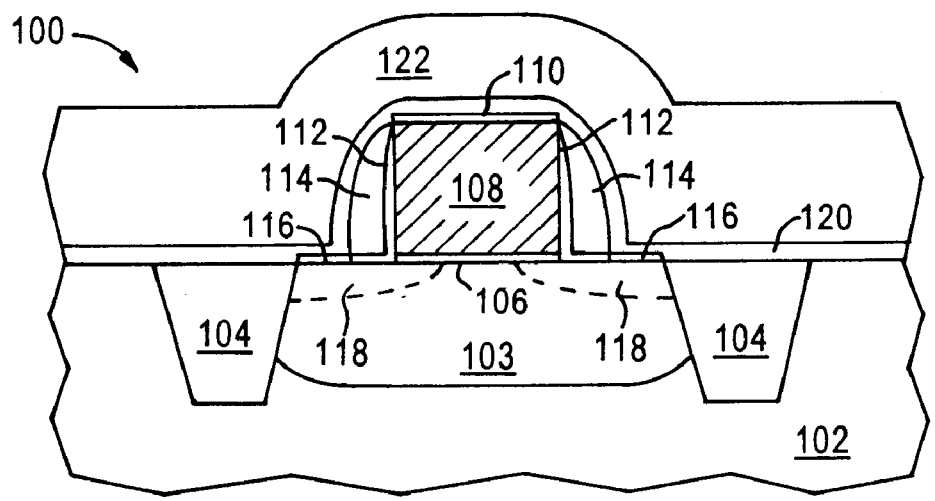
Figure 13:
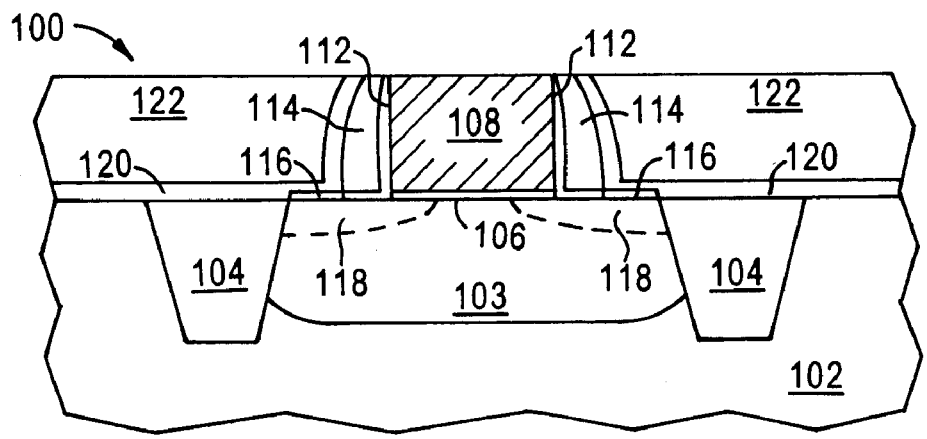
Figure 16:
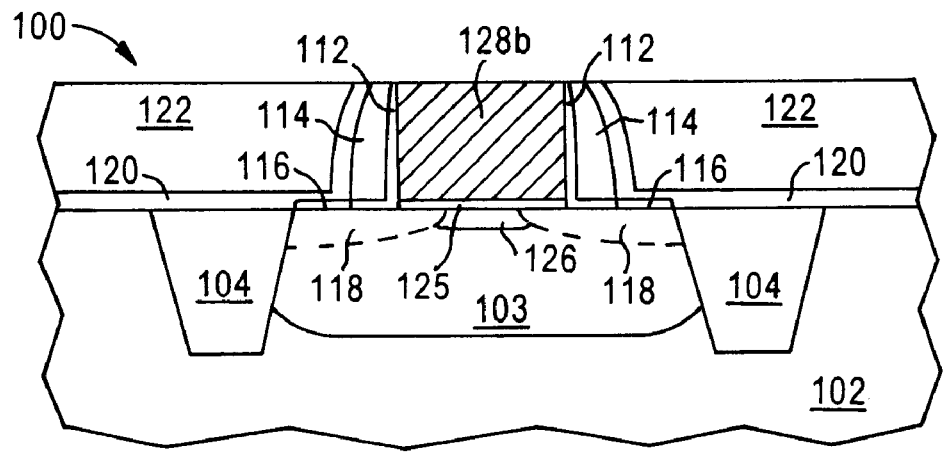
Figure 22:
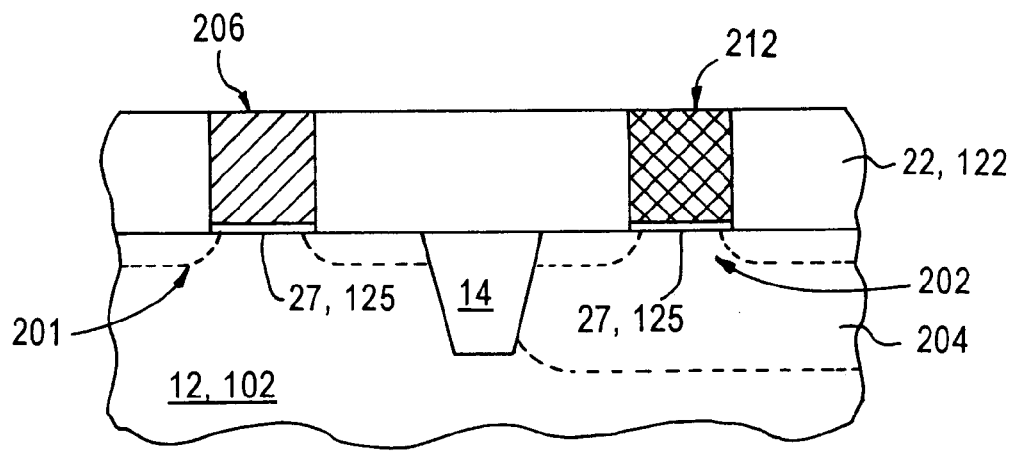

With reference to FIG. 22, in a next step according to the inventive methodology, the thus-formed structure is subjected to planarization processing, typically CMP, to remove (1) the unalloyed/non-silicided portions of the first blanket layer 206 extending over the upper surfaces of the insulative layer 22 or 122; (2) the masking layer segment 208 overlying the unalloyed/non-silicided portions of the first blanket layer; (3) the unalloyed/non-silicided portions of the second blanket layer 210 overlying the masking layer segment 208; and (4) the portions of the alloyed/silicided layer 212 extending over the upper surfaces of the insulative layer 22 or 122. The resulting fully planarized, in-laid metal gate dual transistor (i.e., CMOS) structure shown in FIG. 22 is thus analogous to the fully planarized, in-laid metal gate, single MOS transistor structures illustrated in FIGS. 7 and 16.

It should be recognized that the sequence of processing steps shown in FIGS. 17–22 is not limited to use according to the illustrated example wherein a dual transistor structure is formed, but rather the inventive methodology may be readily adapted and utilized for forming various other MOS and CMOS structures and devices comprising a large plurality of MOS transistors.

As a consequence of the above-described inventive methodology, high- quality, submicron-dimensioned semiconductor devices, such as plural transistor-containing MOS transistor and CMOS devices including in-laid, metal gate electrodes of different compositions may be advantageously formed with carefully and precisely tailored transistor characteristics for use in particular applications. In addition, the inventive methodology enjoys utility in the manufacture of various other semiconductor devices requiring in-laid metal gate electrodes of different compositions. Moreover, the invention can be practiced by use of conventional technologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes or modifications within the scope of the inventive concept as expressed herein.

What is claimed is:

1. A method of manufacturing a semiconductor device including at least two metal-based, in-laid gate electrodes of different composition, comprising the sequential steps of:
   (a) providing a semiconductor substrate;
   (b) forming at least first and second spaced-apart active device precursor regions on or within said semiconductor substrate;
   (c) forming a first metal-based, in-laid gate electrode in electrical contact with said first active device precursor region, said first metal-based, in-laid gate electrode comprised of a first metal; and
   (d) forming a second metal-based, in-laid gate electrode in electrical contact with said second active device precursor region, said second metal-based, in-laid gate electrode comprised of an alloy of said first metal with a second metal or semi-metal or of an electrically conductive silicide of said first metal.

2. The method as in claim 1, wherein:
   step (b) comprises forming spaced-apart transistor precursor regions.

3. The method as in claim 2, wherein:
   step (b) comprises forming spaced-apart transistor precursor regions of different conductivity type.

4. The method as in claim 3, wherein:
   step (b) comprises forming spaced-apart NMOS and PMOS transistor precursor regions.

5. The method as in claim 4, wherein:
   step (b) comprises forming a precursor structure for a CMOS device.

6. The method as in claim 1, wherein:
   step (d) comprises forming an alloy of said first metal with said second metal or semi-metal.

7. The method as in claim 1, wherein:
   step (d) comprises forming an electrically conductive silicide of said first metal.

8. The method as in claim 1, wherein:
   step (c) comprises forming said first metal-based, in-laid gate electrode from a first metal selected from the group consisting of molybdenum (Mo), tungsten (W), titanium (Ti), platinum (Pt) and aluminum (Al); and
   step (d) comprises forming said second metal-based, in-laid gate electrode from an alloy of said first metal with a said second metal or semi-metal selected from elements in Groups IIA–VIA, IB, IIIB–VIIIB of the Periodic Table and lanthanide series elements or from an electrically conductive silicide of said first metal.

9. The method as in claim 1, wherein:
   step (c) includes steps of:
   (i) forming a first blanket layer of said first metal overlying and in electrical contact with each of said first and second active device precursor regions; and
   (ii) selectively forming a layer of a hard mask material on a portion of said first blanket layer overlying said first active device precursor region; and
   step (d) includes steps of:
   (i) forming a second blanket layer of a said second metal or semi-metal or silicon (Si) overlying said second active device precursor region and said layer of hard mask material overlying said first active device precursor region; and
   (ii) effecting alloying or silicidation reaction of at least the portion of said second blanket layer in overlying contact with the portion of said first blanket layer in electrical contact with said second active device precursor region.

10. The method as in claim 9, further including the step of:
    (e) removing said hard mask layer and excess thickness portions of said first and second blanket layers by means of planarization processing.

11. The method as in claim 10, wherein:
    step (e) comprises performing chemical-mechanical polishing (CMP).

* * * * *